United States Patent
Ogai et al.

(10) Patent No.: US 8,542,041 B2
(45) Date of Patent: Sep. 24, 2013

(54) SEMICONDUCTOR DEVICE AND SYSTEM

(75) Inventors: Mitsuhiro Ogai, Yokohama (JP); Hirokazu Yamazaki, Yokohama (JP); Keizo Morita, Yokohama (JP); Kazuaki Yamane, Yokohama (JP); Yasuhiro Fujii, Yokohama (JP); Kazuaki Takai, Yokohama (JP); Shoichiro Kawashima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 171 days.

(21) Appl. No.: 12/755,119

(22) Filed: Apr. 6, 2010

(65) Prior Publication Data

US 2010/0253419 A1 Oct. 7, 2010

(30) Foreign Application Priority Data

Apr. 6, 2009 (JP) ................................. 2009-092145

(51) Int. Cl.
*H03L 7/00* (2006.01)
(52) U.S. Cl.
USPC ......................................................... 327/143
(58) Field of Classification Search
None
See application file for complete search history.

(56) References Cited

U.S. PATENT DOCUMENTS

| 5,602,502 A * | 2/1997 | Jiang ............................. 327/143 |
| 2006/0152255 A1* | 7/2006 | Wang et al. ................... 327/112 |
| 2008/0036538 A1* | 2/2008 | Lee ............................... 330/255 |

FOREIGN PATENT DOCUMENTS

| JP | 2002-100973 A | 4/2002 |
| JP | 2007-306351 A | 11/2007 |

* cited by examiner

*Primary Examiner* — Daniel Rojas
(74) *Attorney, Agent, or Firm* — Arent Fox LLP (57) ABSTRACT

A first transistor has one end and a gate coupled to a first power supply line and other end coupled to a first node. A second transistor has a gate coupled to a second node, one end coupled to the first node, and other end coupled to a third node. A third transistor has one end coupled to a second power supply line, a gate coupled to a fourth node, and other end coupled to the third node. A first bias voltage generation circuit supplies a first bias voltage to the second node. A second bias voltage generation circuit supplies a second bias voltage to the fourth node. Accordingly, the power supply voltage at which the third node is changed from a certain level to another level is set high, and an internal node in a semiconductor device is securely initialized when the power supply voltage is decreased.

10 Claims, 11 Drawing Sheets

SEMICONDUCTOR DEVICE AND SYSTEM

CROSS-REFERENCE TO RELATED APPLICATION

This application is based upon and claims the benefit of priority from Japanese Patent Application No. 2009-092145, filed on Apr. 6, 2009, the entire contents of which are incorporated herein by reference.

FIELD

The present embodiment relates to a semiconductor device and a system.

BACKGROUND

A power supply voltage detection circuit mounted on a semiconductor device generates a reset signal to reset an internal circuit of the semiconductor device during when a power supply voltage is lower than a predetermined voltage. With the use of the reset signal, malfunction of the internal circuit may be reduced while the power supply voltage is low. The power supply voltage detection circuit securely generates the reset signal also when the power supply voltage temporarily decreases and then increases again. A related art is discussed in Japanese Laid-open Patent Publication No. 2007-306351.

SUMMARY

According to an aspect of the embodiments, a semiconductor device includes a first transistor having one end and a gate coupled to a first power supply line to which a power supply voltage is supplied, and other end coupled to a first node; a second transistor having a gate coupled to a second node, one end coupled the first node, and other end coupled to a third node; a third transistor having one end coupled to a second power supply line, a gate coupled to a fourth node, and other end coupled to the third node; a first bias voltage generation circuit supplying a first bias voltage to the second node; and a second bias voltage generation circuit supplying a second bias voltage to the fourth node.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described using the drawings. A transistor denoted by a reference numeral starting with "P" is a p-channel MOS transistor. A transistor denoted by a reference numeral starting with "N" is an n-channel MOS transistor. In the description hereinbelow, the p-channel MOS transistor and the n-channel MOS transistor are also simply referred to as transistors. Unless specially stated, a substrate of the p-channel MOS transistor is coupled to a power supply line VDD, and a substrate of the n-channel MOS transistor is coupled to a ground line VSS being another power supply line.

Figure 1:
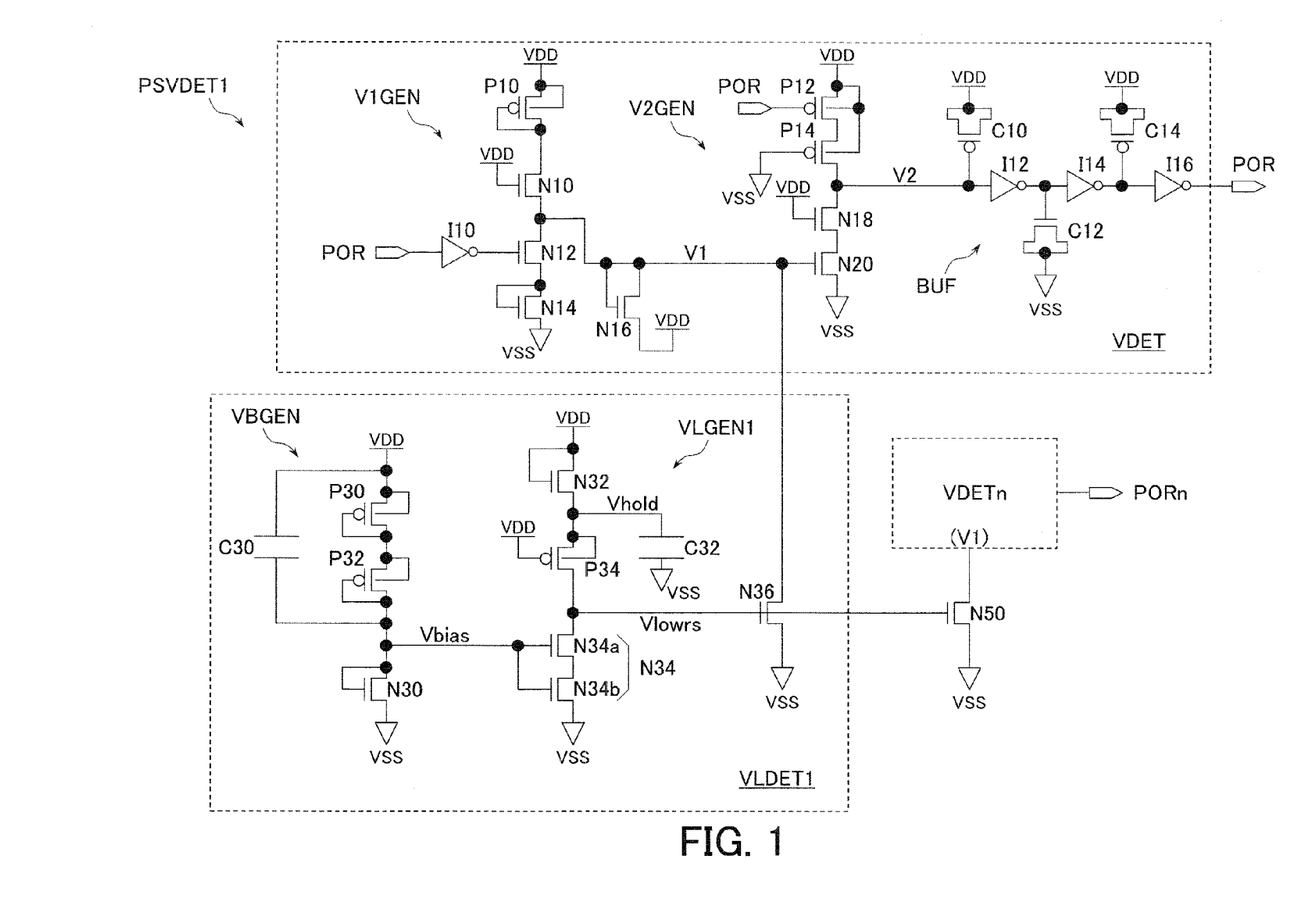
FIG. 1 illustrates an example of a power supply voltage detection circuit in one embodiment.

FIG. 1 illustrates an example of a power supply voltage detection circuit PSVDET1 in one embodiment. For example, the power supply voltage detection circuit PSVDET1 is formed on a silicon substrate as a semiconductor integrated circuit using a CMOS process. Specifically, the power supply voltage detection circuit PSVDET1 is mounted on a semiconductor device. The power supply voltage detection circuit PSVDET1 includes a voltage detection unit VDET and a low voltage detection unit VLDET1. The voltage detection unit VDET includes bias voltage generation circuits V1GEN, V2GEN, and a buffer circuit BUF.

The bias voltage generation circuit V1GEN includes a p-channel MOS transistor P10, n-channel MOS transistors N10, N12, N14 serially coupled between a power supply line VDD and a ground line VSS, a CMOS inverter 110, and an n-channel MOS transistor N16. The transistor P10 has a gate and a drain coupled together, and is diode coupled. A gate of the transistor N10 is coupled to a power supply line VDD. A gate of the transistor N12 receives a power-on reset signal POR generated by the power supply voltage detection circuit PSVDET1 via the inverter 110. The transistor N14 has a gate and a drain coupled together, and is diode coupled. A source of the transistor N10 and a drain of the transistor N12 are coupled to a node V1.

A gate and a source of the transistor N16 are coupled to the node V1, and a drain of the transistor N16 is coupled to a power supply line VDD. The bias voltage generation circuit V1GEN generates a voltage V1 that follows the power supply voltage VDD to increase during a power up period in which the supply of the power supply voltage VDD is started. The transistor N16 pulls out electric charge of the node V1 to the power supply line VDD when the power supply voltage VDD decreases. Accordingly, the voltage V1 decreases to a threshold voltage of the transistor N16.

The bias voltage generation circuit V2GEN includes p-channel MOS transistors P12, P14, and n-channel MOS transistors N18, N20 serially coupled between a power supply line VDD and a ground line VSS. A gate of the transistor P12 receives the power-on reset signal POR. A gate of the transistor P14 is coupled to a ground line VSS. A gate of the transistor N18 is coupled to a power supply line VDD. A gate of the transistor N20 is coupled to the node V1. A drain of the transistor P14 and a drain of the transistor N18 are coupled to a node V2.

A resistance between the node V2 and the ground line VSS (serial on-resistance of the transistors N18, N20) is set to be lower than a resistance between the power supply line VDD and the node V2 (serial on-resistance of the transistors P12, P14). Here, the on-resistance is a resistance generated when a voltage equal to or greater than an absolute value of a threshold voltage of the transistor is applied between a gate and a source of the transistor. Generally, a resistance between a source and a drain of a transistor becomes low by enlarging a ratio W/L between a gate width W and a channel length L, and it becomes high by reducing the ratio W/L. The aforementioned on-resistance is adjusted by changing a gate width or a channel length of at least either of the transistors N18, N20, P12, or P14. For example, the resistance between the node V2 and the ground line VSS becomes low by enlarging the gate width of the transistor N18. Note that it is also possible that the on-resistance is adjusted by an implant dose of ions injected into a channel region of the transistor.

The bias voltage generation circuit V2GEN generates a voltage V2 that follows the power supply voltage VDD to increase during the power up period in which the supply of the power supply voltage VDD is started. The voltage V2 decreases to a ground voltage VSS when the voltage V1 exceeds a threshold voltage of the transistor N20. Accordingly, the power-on reset signal POR is set to a low level until the power supply voltage VDD increases to a predetermined voltage in the power up period, and is kept at a high level thereafter.

The buffer circuit BUF includes CMOS inverters 112, 114, 116 coupled in a line between the node V2 and an output node of the power-on reset signal POR, and capacitors C10, C12, C14 coupled to input terminals of the CMOS inverters 112, 114, 116, respectively. For example, the capacitors C10, C12, C14 are MOS capacitors in which sources and drains of transistors are coupled to power supply lines VDD (or VSS) and gates thereof are coupled to inputs of the inverters (112, 114, 116, respectively). Note that the capacitors C10, C12, C14 may also be ferroelectric capacitors, and may also be formed by using insulator films. The buffer circuit BUF generates the power-on reset signal POR having a voltage corresponding to a logic level opposite to that of the voltage V2. An occurrence of hazard in the power-on reset signal POR at the time of power up may be reduced by the capacitors C10, C12, C14. Specifically, an initial level of the power-on reset signal POR that responds to a change in the voltage V2 at the time of power up is moderately changed because of a capacitive coupling of the capacitors C10, C12, C14.

The low voltage detection unit VLDET1 includes bias voltage generation circuits VBGEN, VLGEN1, and a transistor N36. The bias voltage generation circuit VBGEN includes transistors P30, P32, N30 serially coupled between a power supply line VDD and a ground line VSS and a capacitor C30.

The transistor P30 has a gate and a drain coupled together, and is diode coupled. The transistor P32 has a gate and a drain coupled together, and is diode coupled. The transistor P32 has a substrate coupled to its source. The transistor N30 has a gate and a drain coupled together, and is diode coupled. The drain of the transistor P32 and the drain of the transistor N30 are coupled to a node Vbias. The capacitor C30 is disposed between the power supply line VDD and the node Vbias.

The bias voltage generation circuit VBGEN generates a bias voltage Vbias in accordance with a ratio of dividing resistance of the transistors P30, P32, N30 during the power up period. The voltage Vbias is generated in accordance with the power supply voltage VDD, so that it is lower than the power supply voltage VDD. Concretely, when the power supply voltage VDD is equal to or greater than a predetermined value, the voltage Vbias becomes lower than a value obtained by subtracting a sum of threshold voltages (absolute values) of the transistors P30, P32 from the power supply voltage VDD.

A level of the voltage Vbias may be freely set by adjusting the threshold voltages of the transistors P30, P32, N30, and a capacitance of the capacitor C30. Note that it is also possible to use other resistor elements such as diffusion resistors instead of the transistors P30, P32, N30. The substrates of the transistors P30, P32 may also be coupled to the sources of the respective transistors or the node Vbias. Further, it is also possible to dispose diode coupled n-channel MOS transistors instead of the transistors P30, P32. In addition, the number of transistors P30, P32 disposed between the power supply line VDD and the node Vbias may also be three or more, and may also be one. When the number of transistors serially disposed between the power supply line VDD and the node Vbias is large, the voltage Vbias becomes low.

The bias voltage generation circuit VLGEN1 includes transistors N32, P34, N34a, N34b serially coupled between a power supply line VDD and a ground line VSS and a capacitor C32. The transistor N32 has a gate and a drain coupled together, and is diode coupled. A gate of the transistor P34 is coupled to a power supply line VDD. A substrate of the transistor P34 is coupled to its source. Note that it is also possible to couple an output of a bias voltage generation circuit that generates the same voltage as the power supply voltage VDD to the gate of the transistor P34. A source of the transistor N32 and the source of the transistor P34 are coupled to a node Vhold. The capacitor C32 is disposed between the node Vhold and a ground line VSS.

Gates of the transistors N34a, N34b are coupled to the node Vbias. A drain of the transistor P34 and a drain of the transistor N34a are coupled to a node Vlowrs. The transistors N34a, N34b form a transistor string N34. Note that the number of transistors that form the transistor string N34 may also be three or more, and may also be one. When the number of transistors is large, the voltage Vbias at which the transistor string N34 is turned off becomes high. When the number of transistors is small, the voltage Vbias at which the transistor string N34 is turned off becomes low.

The bias voltage generation circuit VLGEN1 turns on the transistors N34a, N34b using a high level voltage Vbias and sets the node Vlowrs to a low level during the power up period and a power keep period in which the power supply voltage VDD is kept at a predetermined voltage. Further, the bias voltage generation circuit VLGEN1 accumulates, during the power up period and the power keep period, electric charge in the capacitor C32 in accordance with a voltage applied to the node Vhold. The bias voltage generation circuit VLGEN1 turns off the transistors N34a, N34b using a low level voltage Vbias during a power down period in which the supply of the power supply voltage VDD is stopped. Further, the bias voltage generation circuit VLGEN1 turns on the transistor P34 in accordance with the decrease in the power supply voltage VDD and sets the node Vlowrs to a high level during the power down period.

A gate, a source, and a drain of the transistor N36 are coupled to the node Vlowrs, a ground line VSS, and the node V1 in the voltage detection unit VDET, respectively. The transistor N36 is turned on when a voltage Vlowrs is increased during the power down period, and couples the node V1 to the ground line VSS. Note that the capacitors C30, C32 may also be formed by using insulator films, and may also be MOS capacitors or ferroelectric capacitors.

A drain of a transistor N50 whose gate is coupled to the node Vlowrs is coupled to a node corresponding to a node V1 in another voltage detection unit VDETn. Accordingly, it is possible to reset nodes (V1, for instance) in a plurality of voltage detection units VDET, VDETn to the ground voltage VSS using a common voltage Vlowrs during the power down period. However, it is not necessary to form the transistor N50 and the voltage detection unit VDETn in the semiconductor device.

Figure 2:
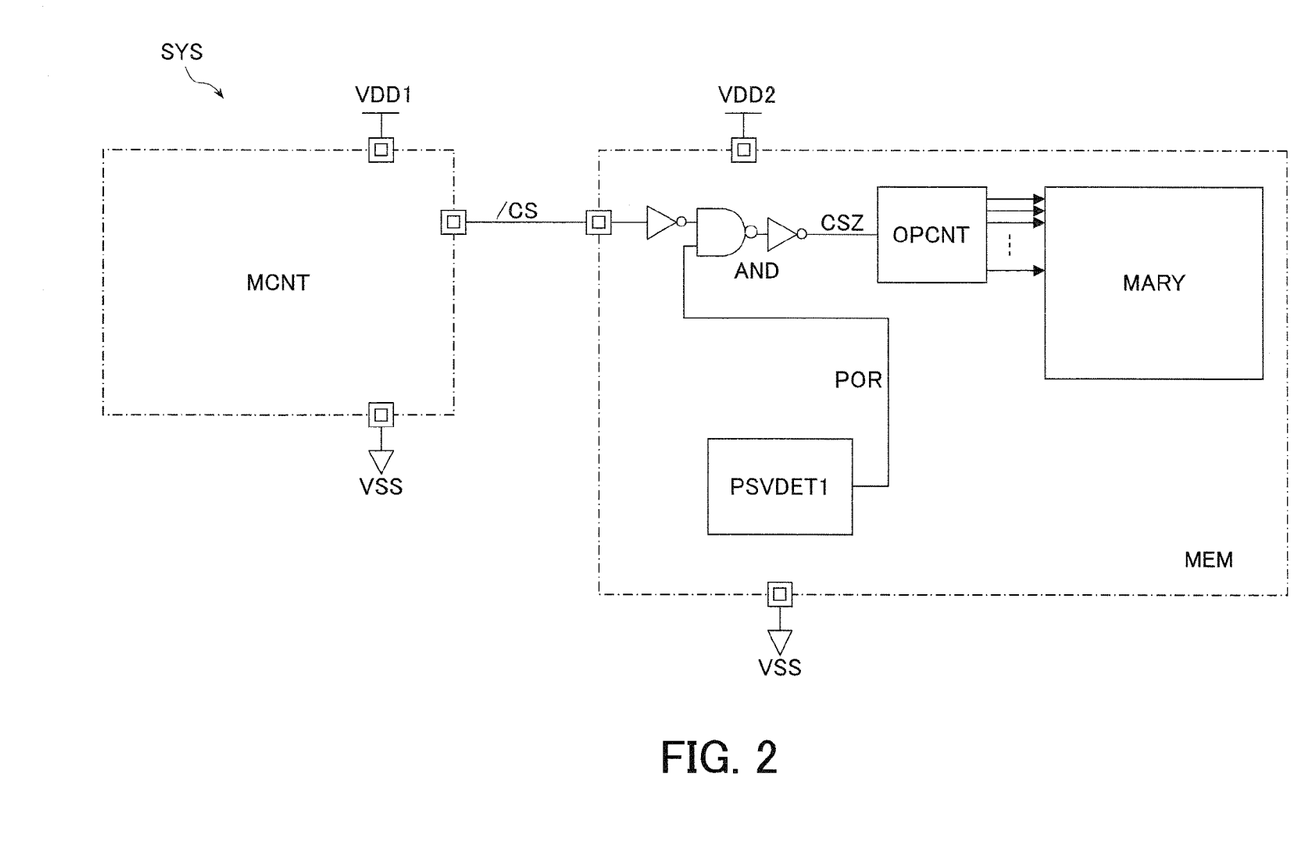
FIG. 2 illustrates an example of a system in which the power supply voltage detection circuit illustrated in FIG. 1 is mounted.

FIG. 2 illustrates an example of a system SYS in which the power supply voltage detection circuit PSVDET1 illustrated in FIG. 1 is mounted. For example, the system SYS forms at least a part of a microcomputer system of a portable equipment and the like. The system SYS includes a semiconductor memory MEM and a controller MCNT that accesses the semiconductor memory MEM. The semiconductor memory MEM is, for instance, a ferroelectric memory, an FCRAM (Fast Cycle RAM), an SRAM, or a flash memory. The controller MCNT is, for instance, a CPU or a memory controller. Note that in later-described embodiments, either of power supply voltage detection circuits PSVDET2-4 is mounted, instead of the power supply voltage detection circuit PSVDET1, in the same system SYS as in FIG. 2.

Although not specially limited, the system SYS includes a multichip package formed by stacking the controller chip MCNT and the semiconductor memory chip MEM on a system board. As a formation of the system SYS, a system-in-package, a chip-on-chip CoC, or a package-on-package PoP may also be adopted. Alternatively, the formation of the system SYS may also adopt a system-on-chip in which the controller MCNT and the semiconductor memory MEM are mounted on the same chip.

The semiconductor memory MEM becomes an active state while it receives a low level chip select signal/CS from the controller MCNT, and executes a write operation and a read operation in response to an access command. A command signal that supplies the access command to the semiconductor memory MEM, an address signal, and a data signal are omitted in FIG. 2.

The power supply voltage detection circuit PSVDET1 outputs a low level power-on reset signal POR during when the power supply voltage VDD is low. While receiving the low level power-on reset signal POR, an AND circuit prohibits the chip select signal/CS for activating the semiconductor memory MEM from being output as a chip select signal CSZ. Specifically, the AND circuit keeps the chip select signal CSZ at a low level regardless of the level of the chip select signal/CS while it receives the low level power-on reset signal POR. Note that "Z" at the last of the chip select signal CSZ indicates that the signal is a positive logic signal. Accordingly, an operation control circuit OPCNT is prohibited from operating during when the power supply voltage VDD is low, which prohibits a memory cell array MARY from being accessed. As a result of this, a malfunction of the semiconductor memory MEM when the power supply voltage VDD is low is prohibited.

In FIG. 2, the controller MCNT operates by receiving a power supply voltage VDD1. The controller MCNT may be operated even in a period in which a supply of a power supply voltage VDD2 to the semiconductor memory MEM is stopped, and may output the chip select signal/CS. Also in this case, the semiconductor memory MEM may securely mask, by using the AND circuit, the chip select signal/CS supplied during when the power supply voltage VDD2 is low. Note that the power supply voltage detection circuits PSVDET1-4 may also be mounted, not on the semiconductor memory MEM, but on another semiconductor device such as a CPU and a logic LSI.

Figure 3:
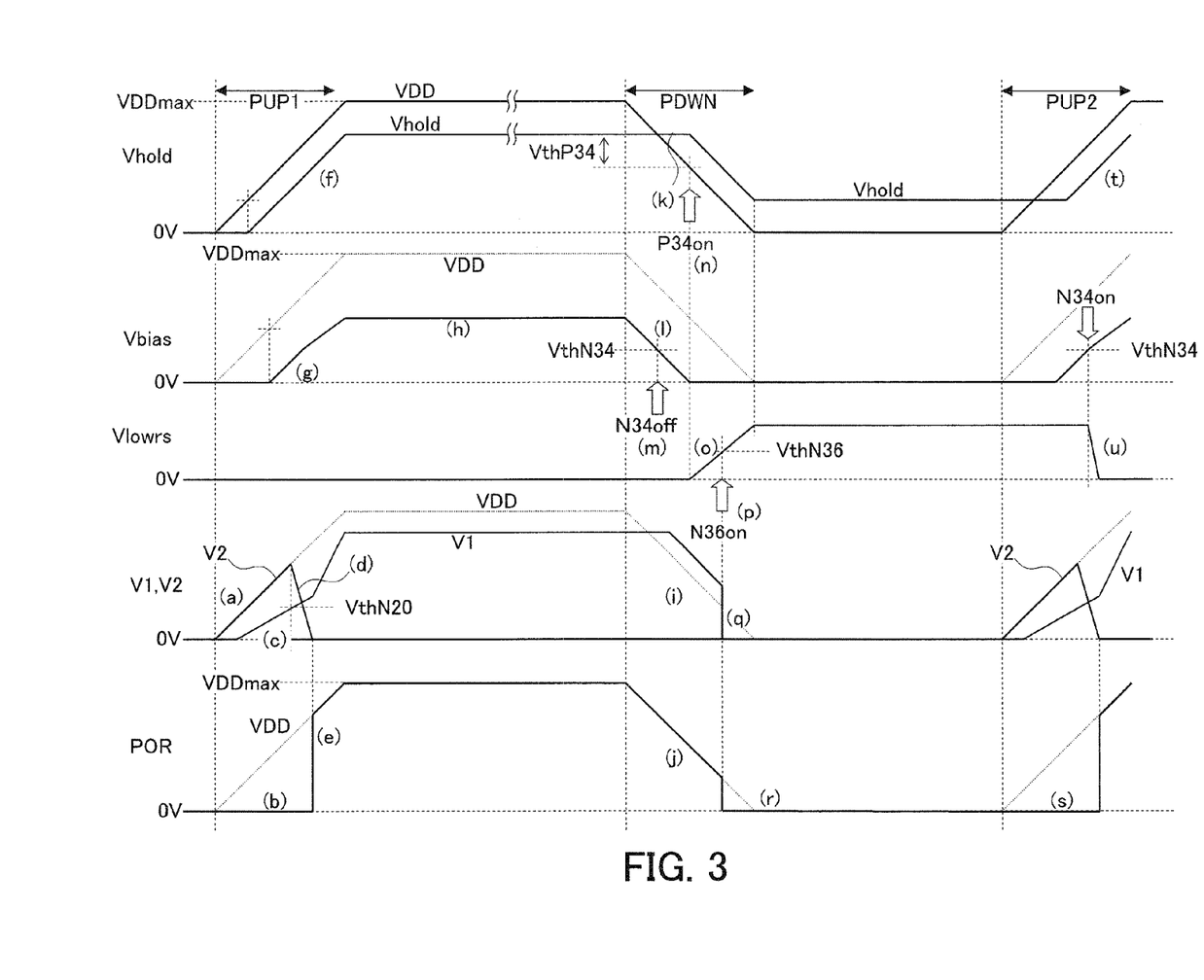
FIG. 3 illustrates an example of operation of the power supply voltage detection circuit illustrated in FIG. 1.

FIG. 3 illustrates an example of operation of the power supply voltage detection circuit PSVDET1 illustrated in FIG. 1. At first, an initial power up period PUP1 during which the supply of the power supply voltage VDD is started will be described. A voltage of the node V2 in the voltage detection unit VDET increases together with the power supply voltage VDD (FIG. 3(a)). The voltage V2 is substantially the same as the power supply voltage VDD. The voltage detection unit VDET outputs a low level power-on reset signal POR during when the voltage V2 is at a high level (FIG. 3(b)).

When the transistor P10 is turned on in accordance with the increase in the power supply voltage VDD, a voltage of the node V1 starts to increase by following the power supply voltage VDD (FIG. 3(c)). Here, although the transistor N12 is turned on during when the power supply voltage VDD is low, the voltage of the node V1 increases because of the dividing resistance. When the power supply voltage VDD further increases and the voltage V1 exceeds a threshold voltage VthN20 of the transistor N20, the transistor N20 is turned on. Accordingly, the node V2 is coupled to the ground line VSS via the transistors N18, N20. Since the on-resistance of the transistors N18, N20 is lower than the on-resistance of the transistors P12, P14, the voltage of the voltage V2 gradually decreases toward the ground voltage VSS (FIG. 3(d)). Accordingly, the power-on reset signal POR is changed from a low level (VSS) to a high level (VDD) (FIG. 3(e)). The transistors N12, P12 are turned off by the high level power-on reset signal POR. This enables to reduce a leak current generated in the voltage detection unit VDET.

Meanwhile, when the supply of the power supply voltage VDD is started, the transistor P34 in the low voltage detection unit VLDET1 is turned off since the gate thereof receives the power supply voltage VDD which is higher than the voltage Vhold. Accordingly, the voltage of the node Vhold increases by following the increase in the power supply voltage VDD (FIG. 3(f)). The voltage Vhold is lower than the power supply voltage VDD by a threshold voltage of the transistor N32. The voltage Vhold makes electric charge to be accumulated in the capacitor C32.

When the transistors P30, P32 are turned on in accordance with the increase in the power supply voltage VDD, the voltage of the node Vbias follows the power supply voltage VDD to increase (FIG. 3(g)). The voltage Vbias starts to increase when the power supply voltage VDD exceeds a sum of threshold voltages (absolute values) of the transistors P30, P32. When the voltage Vbias exceeds the threshold voltage of the transistor N30, the transistor N30 is turned on.

In the power keep period in which the power supply voltage VDD is kept at a predetermined high level VDDmax, the voltage Vbias is stabilized at a value determined by a ratio (ratio of dividing resistance) between an on-resistance of a transistor string P30, P32 and an on-resistance of the transistor N30 (FIG. 3(h)). The electric charge is accumulated in the capacitor C30 in accordance with a difference between the power supply voltage VDD and the voltage of the node Vbias. Actually, the on-resistance of the transistor N30 is set to be lower than the on-resistance of the transistor string P30, P32. Accordingly, the voltage Vbias is stabilized at a level slightly higher than that of the threshold voltage of the transistor N30. When the power supply voltage VDD is increased to a predetermined voltage, the transistor string N34a, N34b is turned on by receiving the voltage Vbias. Accordingly, the node Vlowrs is kept at a low level. In other words, threshold voltages of the respective transistors N34a, N34b are set at values at which the transistors N34a, N34b are turned on when the voltage of the node Vbias is stabilized.

Next, a power down period PDWN in which the power supply voltage VDD temporarily decreases will be described. The voltage V1 decreases when the transistor N16 is turned on in accordance with the decrease in the power supply voltage VDD (FIG. 3(i)). A high level voltage of the power-on reset signal POR decreases in accordance with the decrease in the power supply voltage VDD supplied to the inverter 116 (FIG. 3(j)).

In the low voltage detection unit VLDET1, the diode coupled transistor N32 is brought into an inverse bias state due to the decrease in the power supply voltage VDD and is turned off. The transistor P34 is turned off during when a sum of the power supply voltage VDD and a threshold voltage (absolute value) of the transistor P34 is greater than the voltage Vhold. Accordingly, while the power supply voltage VDD is high, no movement of electric charge occurs from the node Vhold to the power supply line VDD and the node Vlowrs, and the voltage Vhold is kept constant (FIG. 3(k)).

The transistors P30, P32 are diode coupled, so that there is no movement of electric charge from the node Vbias to the power supply line VDD even when the power supply voltage VDD decreases. The transistor N30 is turned off when the voltage of the node Vbias is equal to lower than the threshold voltage of the transistor N30. Accordingly, the voltage Vbias becomes equal to or lower than the threshold voltage of the transistor N30 due to the decrease in the power supply voltage VDD, and thereafter, it decreases in accordance with the decrease in the power supply voltage VDD because of a coupling action of the capacitor C30 (FIG. 3(l)). The voltage Vbias is always lower than the power supply voltage VDD. Note that because of the coupling action of the capacitor C30, the voltage Vbias may have a value obtained by subtracting the threshold voltage of the transistor N30 from the ground voltage VSS (negative voltage). However, there is no problem since it is only required that the transistor string N34 may be turned off by the voltage Vbias at a low level.

When the voltage of the node Vbias becomes lower than a threshold voltage of the transistor string N34, the transistors N34a, N34b are turned off (FIG. 3(m)). When the power supply voltage VDD further decreases and a difference between the power supply voltage VDD and the voltage Vhold becomes greater than the threshold voltage of the transistor P34 (absolute value VthP34), the transistor P34 is turned on (FIG. 3(n)). Accordingly, the electric charge accumulated in the capacitor C32 move to the node Vlowrs, and the voltage Vlowrs increases in accordance with the decrease in the voltage Vhold (FIG. 3(o)). The difference between the voltage Vhold and the power supply voltage VDD is kept the same as the threshold voltage of the transistor P34 (absolute value VthP34).

When the voltage of the node Vlowrs exceeds a threshold voltage VthN36 of the transistor N36, the transistor N36 is turned on (FIG. 3(p)). Accordingly, the node V1 in the voltage detection unit VDET is initialized to a low level (0V) (FIG. 3(q)). The level of the power-on reset signal POR decreases together with the power supply voltage VDD (FIG. 3(r)).

As illustrated in FIG. 3, by turning on the transistor P34 after the transistor string N34 is turned off, flowing into the ground line VSS via the transistor string N34 may reduced by the electric charge accumulated in the capacitor C32. Also when the power supply voltage VDD slowly decreases, almost all of the electric charge accumulated in the capacitor C32 may be contributed to increase the voltage of the node Vlowrs. Accordingly, the voltage of the node Vlowrs may be highly increased, which enables to securely turn on the transistor N36. As a result of this, the node V1 may be securely reset to a low level.

Note that, depending on a threshold voltage of the transistor in the low voltage detection unit VLDET1, the transistor P34 is turned on before the transistor string N34 is turned off. At this time, a part of the electric charge accumulated in the capacitor C32 flows into the ground line VSS via the transistor string N34, which reduces the electric charge that contribute to the increase in the voltage of the node Vlowrs. However, since the power supply voltage VDD at which the transistor string N34 is turned off is high, it is possible to supply the electric charge from the power supply line VDD to the node Vhold by turning on the transistor N32. Accordingly, the voltage Vlowrs may be increased to a sufficient value to turn on the transistor N36.

Next, an explanation will be made on a power up period PUP2 in which the supply of the power supply voltage VDD is started again. When the power up period PUP2 is started, the voltage V1 is reset to the ground voltage VSS. Accordingly, the voltages V1, V2, and POR have the same waveforms as those in the power up period PUP1. Specifically, it is possible to securely keep the power-on reset signal POR at a low level when the power supply voltage VDD is started to increase (FIG. 3(s)). As a result of this, a malfunction of an internal circuit such as the operation control circuit OPCNT illustrated in FIG. 2 may be reduced, and to securely initialize an internal circuit such as a latch circuit LT.

When the power supply voltage VDD increases again, the voltage Vhold follows the power supply voltage VDD to increase (FIG. 3(t)). The voltage Vhold is lower than the power supply voltage VDD by the threshold voltage of the transistor N32. Further, the voltage Vhold makes the electric charge to be accumulated in the capacitor C32. When the voltage Vbias exceeds a threshold voltage VthN34 of the transistor string N34, the transistor string N34 is turned on, and the voltage Vlowrs decreases to the ground voltage VSS (FIG. 3(u)). Accordingly, a voltage waveform of each node in the power supply voltage detection circuit PSVDET1 becomes the same as that after the initial power up period PUP1.

Figure 4:
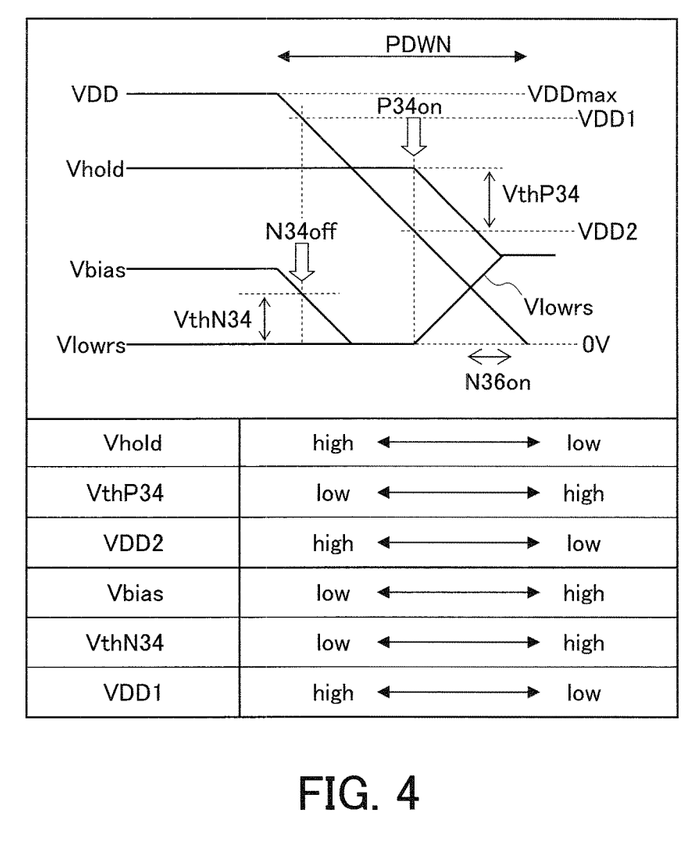
FIG. 4 illustrates an operating characteristic during a power down period illustrated in FIG. 3.

FIG. 4 illustrates an operating characteristic during the power down period PDWN illustrated in FIG. 3. In the power supply voltage detection circuit PSVDET1 illustrated in FIG. 1, as the voltage Vhold at the start of the power down period PDWN is higher, the power supply voltage VDD2 at which the transistor P34 is turned on may be set higher. Further, as the absolute value VthP34 of the threshold voltage of the transistor P34 is lower, the power supply voltage VDD2 at which the transistor P34 is turned on may be set higher. Since it is possible to make the voltage Vlowrs rise in a period during which the power supply voltage VDD is high, the transistor N36 may be securely turned on (N36 on), and the node V1 may be securely reset.

Meanwhile, as the voltage Vbias at the start of the power down period PDWN is lower, the power supply voltage VDD1 at which the transistor string N34 is turned off may be set higher. Further, as the threshold voltage VthN34 of the transistor string N34 is lower, the power supply voltage VDD1 at which the transistor string N34 is turned off may be set higher. Accordingly, the transistor string N34 may be turned off before the transistor P34 is turned on, and an unnecessary leak current from flowing in the bias voltage generation circuit VLGEN1 may be reduced. As a result of this, it is possible to efficiently increase the voltage Vlowrs and to securely turn on the transistor N36.

Figure 5:
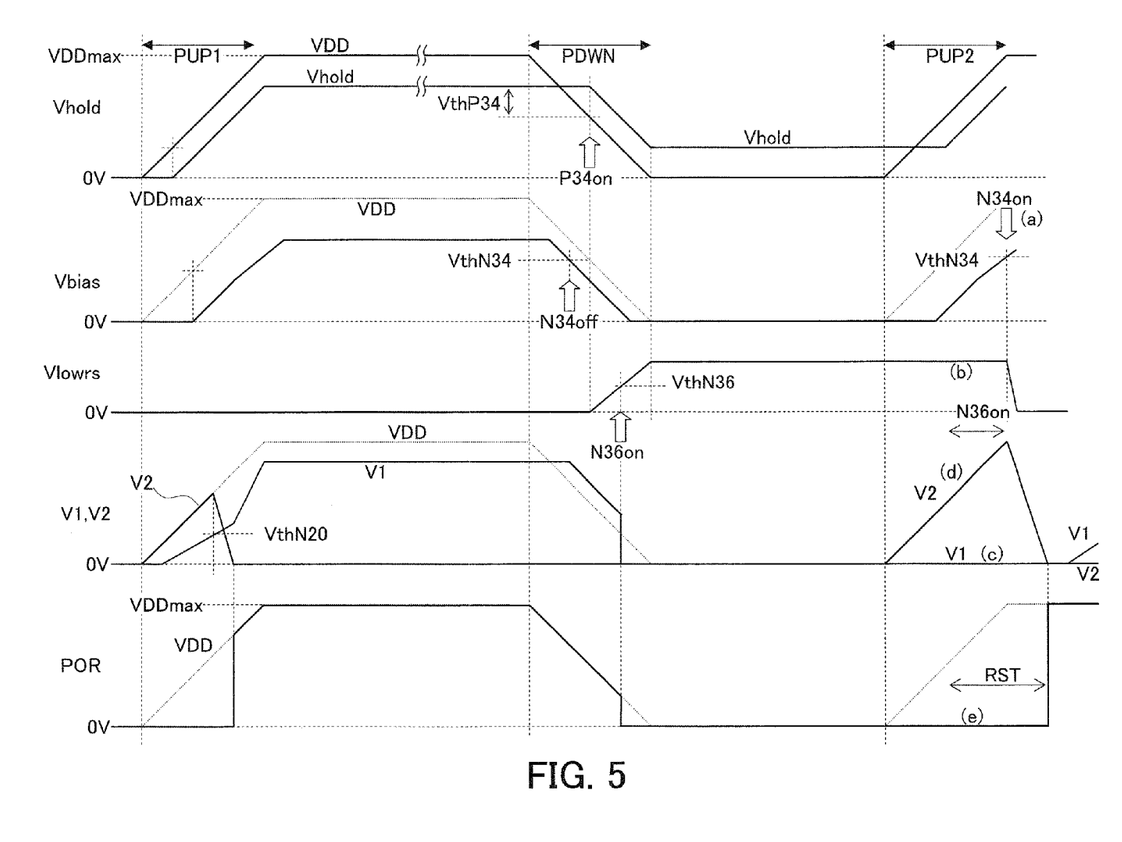
FIG. 5 illustrates another example of operation of the power supply voltage detection circuit illustrated in FIG. 1.

FIG. 5 illustrates another example of operation of the power supply voltage detection circuit PSVDET1 illustrated in FIG. 1. In this example, the threshold voltage of the transistor string N34 in the bias voltage generation circuit VLGEN1 is designed high. An operation during the power up period PUP1 is the same as that in FIG. 3. An operation during the power down period PDWN is the same as that in FIG. 3 except that the power supply voltage VDD at which the transistor string N34 is turned off is high.

During the power up period PUP2 in which the power supply voltage VDD increases again, since the threshold voltage of the transistor string N34 is high, the transistor string N34 is turned on after the power supply voltage VDD is sufficiently increased (FIG. 5(a)). The voltage Vlowrs is kept at a high level until the transistor string N34 is turned on (FIG. 5(b)). During when the voltage Vlowrs is at a high level, the transistor N36 is turned on (N36 on) and the node V1 is kept at a low level (FIG. 5(c)). Accordingly, the transistor N20 in the voltage detection unit VDET illustrated in FIG. 1 keeps an off state, and the voltage of the node V2 follows the power supply voltage VDD to increase (FIG. 5(d)).

During when a logic level of the voltage V2 is a high level, the power-on reset signal POR is kept at a low level (FIG. 5(e)). Specifically, in the power up period PUP2 illustrated in FIG. 5, the power-on reset signal POR is kept at a low level until the power supply voltage VDD is sufficiently increased. Therefore, a period (reset period RST) during which the operation of the operation control circuit OPCNT illustrated in FIG. 2 and the latch circuit LT is prohibited may be set long. This enables to securely prohibit the malfunction of the semiconductor memory MEM. Note that the operation illustrated in FIG. 5 may be realized also in other embodiments to be described later. Specifically, also in power supply voltage detection circuits PSVDET2-4 illustrated in FIG. 6, FIG. 8 and FIG. 9, by designing a high threshold voltage of the transistor string N34, the reset period RST may be set long. As a result of this, the malfunction of the semiconductor memory MEM may be securely prohibited.

As described above, in this embodiment, by supplying the voltages VDD, Vbias to the gate of the transistor P34 and the gates of the transistors N34a, N34b, respectively, the power supply voltage at which the transistor P34 is turned on and the power supply voltage at which the transistors N34a, N34b are turned off may be respectively set. Accordingly, for instance, the power supply voltage at which the node Vlowrs mutually coupling the transistors P34, N34a, N34b is changed from a certain level to another level may be set high. Concretely, the operation of transistor P34 for setting the node Vlowrs to a high level and the operation of transistors N34a, N34b for setting the node Vlowrs to a low level are controlled by using mutually different voltages VDD, Vbias. Accordingly, the power supply voltage VDD at which the voltage Vlowrs is changed to a high level may be set high. Particularly, by setting the voltage Vbias to be constantly lower than the power supply voltage VDD and making the voltage Vbias follow the power supply voltage VDD to decrease with the use of the coupling capacitor C30, it is possible to increase the voltage of the node Vlowrs during when the power supply voltage VDD is high. Therefore, when the power supply voltage VDD decreases, the node V1 may be initialized to a low level during when the power supply voltage VDD is high. When the power supply voltage VDD is increased again, a low level period of the power-on reset signal POR may be surely secured, the malfunction of the internal circuit such as the operation control circuit OPCNT may be reduced, and the internal circuit such as the latch circuit LT may be securely initialized.

Further, by releasing the reset state (low level) of the node Vlowrs by turning off the transistor string N34 and then by starting the supply of electric charge to the node Vlowrs by turning on the transistor P34, the voltage Vlowrs may be efficiently increased. Also when the power supply voltage VDD gradually decreases, it is possible to minimize the leak of electric charge accumulated in the capacitor C32. Therefore, the transistor N36 may be securely turned on. The power supply voltage VDD at which the transistor N36 is turned on may be easily adjusted by adjusting a threshold voltage of the transistor in the low voltage detection unit VLDET1.

Figure 6:
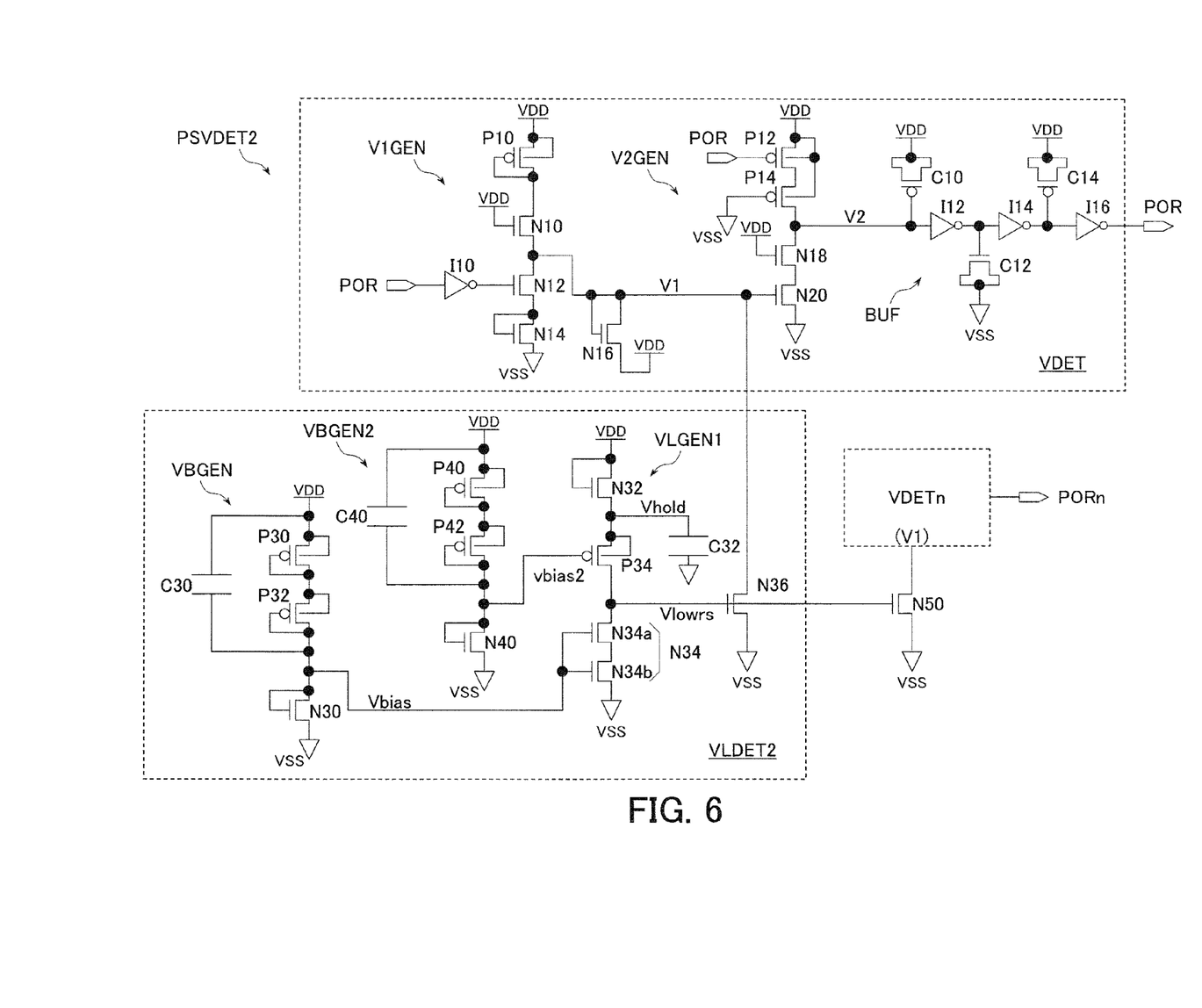
FIG. 6 illustrates an example of a power supply voltage detection circuit in another embodiment.

FIG. 6 illustrates an example of a power supply voltage detection circuit PSVDET2 in another embodiment. The same elements as those described in the aforementioned embodiment are denoted by the same reference numerals, and a detail explanation thereof will be omitted. The power supply voltage detection circuit PSVDET2 includes a low voltage detection unit VLDET2 instead of the low voltage detection unit VLDET1 illustrated in FIG. 1. The other configurations of the circuit are the same as those in FIG. 1. For example, the power supply voltage detection circuit PSVDET2 is formed on a silicon substrate as a semiconductor integrated circuit using a CMOS process.

The low voltage detection unit VLDET2 includes a bias voltage generation circuit VBGEN2 coupled to the gate of the transistor P34. The other configurations of the low voltage detection unit VLDET2 are the same as those of the low voltage detection unit VLDET1 illustrated in FIG. 1. The bias voltage generation circuit VBGEN2 has the same circuit configuration as the bias voltage generation circuit VBGEN. Specifically, the bias voltage generation circuit VBGEN2 includes transistors P40, P42, N40 serially coupled between a power supply line VDD and a ground line VSS, and a capacitor C40.

A drain of the transistor P42 and a drain of the transistor N40 are coupled to a node Vbias2. The node Vbias2 is coupled to a gate of the transistor P34. The capacitor C40 is disposed between the power supply line VDD and the node Vbias2. The bias voltage generation circuit VBGEN2 generates a bias voltage Vbias2 in accordance with a ratio of dividing resistance of the transistors P40, P42, N40 during the power up period. The voltage Vbias2 is generated in accordance with the power supply voltage VDD, so that it is lower than the power supply voltage VDD. In the bias voltage generation circuit VBGEN2, threshold voltages of the transistors are adjusted to generate the voltage Vbias2 that is higher than the voltage Vbias. For example, absolute values of threshold voltages of the transistors P40, P42 are designed smaller than the absolute values of the threshold voltages of the transistors P30, P32. Alternatively, a threshold voltage of the transistor N40 is designed higher than the threshold voltage of the transistor N30.

Figure 7:
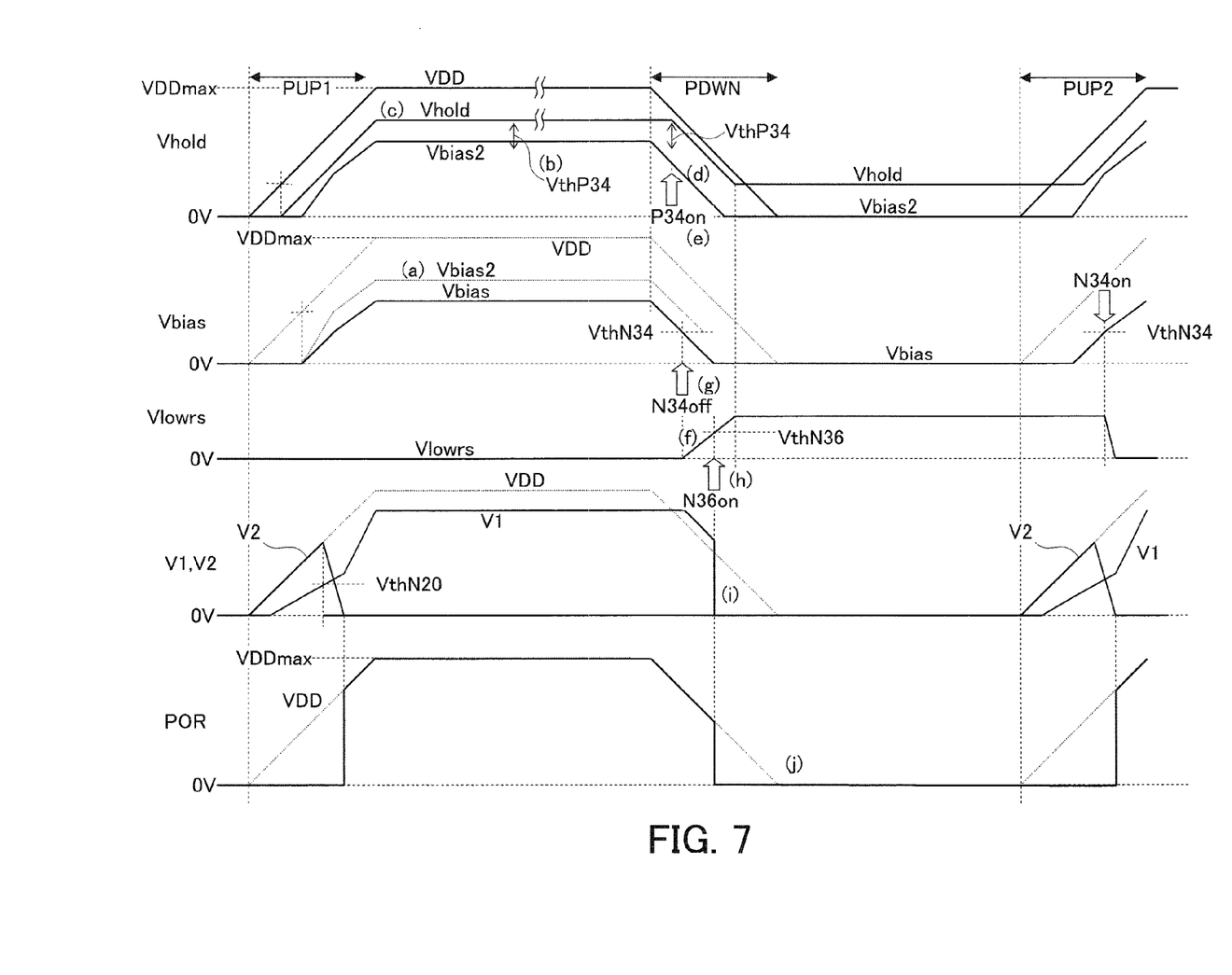
FIG. 7 illustrates an example of operation of the power supply voltage detection circuit illustrated in FIG. 6.

FIG. 7 illustrates an example of operation of the power supply voltage detection circuit PSVDET2 illustrated in FIG. 6. A detailed explanation regarding the same operation as that in FIG. 3 will be omitted. The power supply voltage VDD, the voltages Vbias, V1, V2, and the power-on reset signal POR have the same waveforms as those in FIG. 3.

In this embodiment, the voltage Vbias2 whose value is between the power supply voltage VDD and the voltage Vbias is generated (FIG. 7(a)). A difference between the voltage Vhold and the voltage Vbias2 is smaller than the absolute value VthP34 of the threshold voltage of the transistor P34 until the power supply voltage VDD is increased to the maximum value VDDmax (FIG. 7(b)). Accordingly, the transistor P34 is turned off, the electric charge is accumulated in the capacitor C32, and the voltage Vhold is increased (FIG. 7(c)).

The other operations before the power down period PDWN are the same as those in FIG. 3.

In the power down period PDWN, the voltage Vbias2, similar to the voltage Vbias, becomes equal to or lower than the threshold voltage of the transistor N40, and thereafter, it decreases in accordance with the decrease in the power supply voltage VDD because of a coupling action of the capacitor C40 (FIG. 7(d)). Accordingly, the voltages Vbias1 and Vbias2 are always lower than the power supply voltage VDD. Note that because of the coupling action of the capacitor C40, the voltage Vbias2 may have a value obtained by subtracting the threshold voltage of the transistor N40 from the ground voltage VSS (negative voltage).

When the difference between the voltage Vbias2 and the voltage Vhold becomes greater than the threshold voltage of the transistor P34 (absolute value VthP34), the transistor P34 is turned on (FIG. 7(e)). Accordingly, the electric charge accumulated in the capacitor C32 move to the node Vlowrs, and the voltage Vlowrs increases in accordance with the decrease in the voltage Vhold (FIG. 7(f)). The difference between the voltage Vhold and the power supply voltage VDD is kept the same as the threshold voltage of the transistor P34 (absolute value VthP34).

Further, similar to FIG. 3, when the voltage of the node Vbias becomes lower than the threshold voltage of the transistor string N34, the respective transistors N34a, N34b are turned off (FIG. 7(g)). When the voltage of the node Vlowrs exceeds the threshold voltage VthN36 of the transistor N36, the transistor N36 is turned on (FIG. 7(h)). Accordingly, the node V1 in the voltage detection unit VDET is initialized to a low level (0V), similar to FIG. 3 (FIG. 7(i)). The level of the power-on reset signal POR decreases together with the power supply voltage VDD (FIG. 7(j)). The operation during the power up period PUP2 is the same as that in FIG. 3.

As described above, also in this embodiment, the same effect as that of the aforementioned embodiment may be obtained. Further, by supplying the voltage Vbias2 generated by the bias voltage generation circuit VBGEN2 to the gate of the transistor P34, the power supply voltage VDD at which the transistor P34 is turned on may be adjusted more widely, compared to FIG. 1. In other words, an on-timing of the transistor P34 may be adjusted without depending on the power supply voltage VDD. As a result of this, the power supply voltage VDD at which the node V1 is reset to a low level may be freely adjusted.

Figure 8:
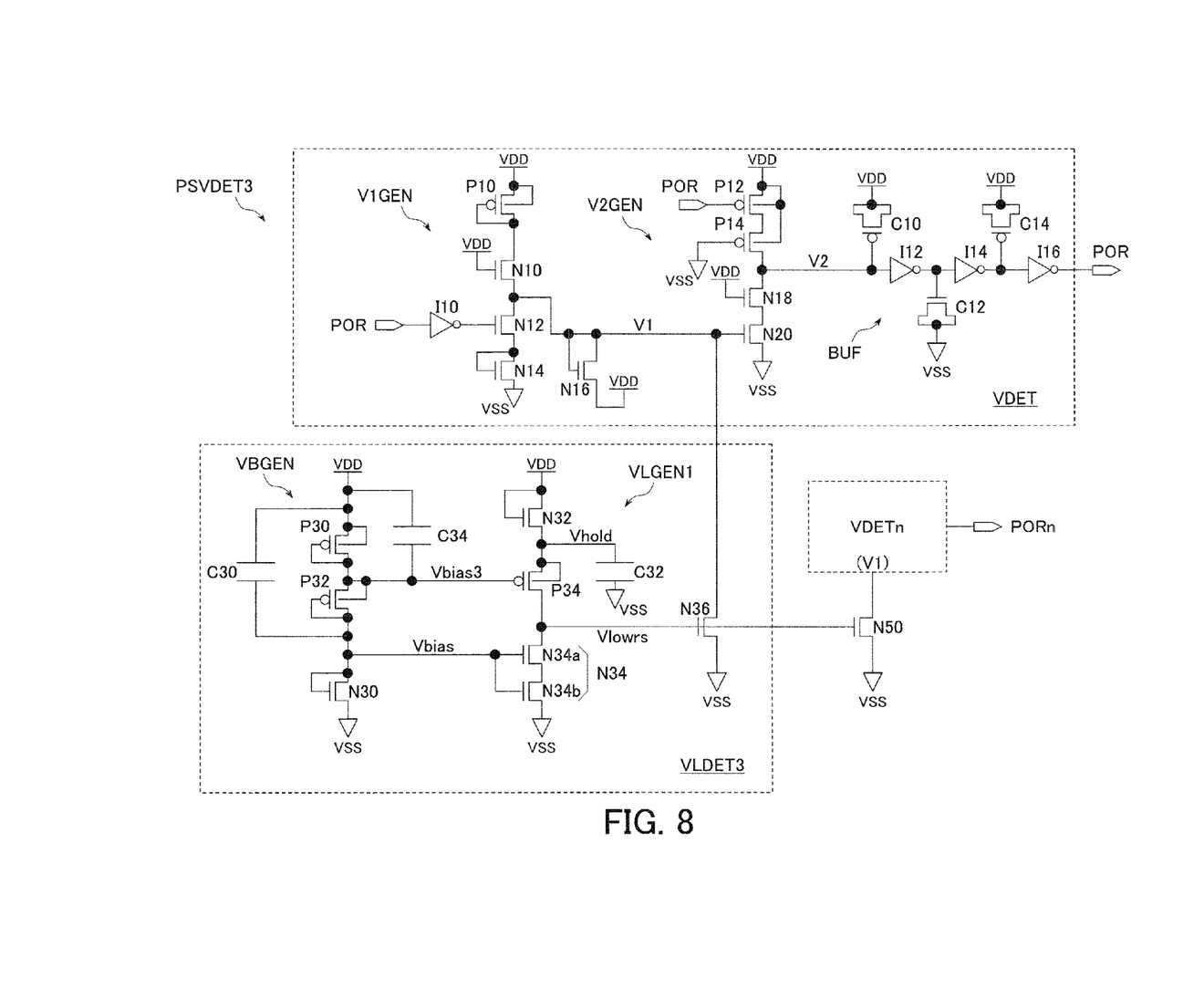
FIG. 8 illustrates an example of a power supply voltage detection circuit in still another embodiment.

FIG. 8 illustrates an example of a power supply voltage detection circuit PSVDET3 in still another embodiment. The same elements as those described in the aforementioned embodiments are denoted by the same reference numerals, and a detail explanation thereof will be omitted. The power supply voltage detection circuit PSVDET3 includes a low voltage detection unit VLDET3 instead of the low voltage detection unit VLDET1 illustrated in FIG. 1. The other configurations of the circuit are the same as those in FIG. 1. For example, the power supply voltage detection circuit PSVDET3 is formed on a silicon substrate as a semiconductor integrated circuit using a CMOS process.

In the low voltage detection unit VLDET3, the gate of the transistor P34 is coupled to a node Vbias3. The node Vbias3 is coupled to the source of the transistor P32. Further, the low voltage detection unit VLDET3 includes a capacitor C34 disposed between the power supply line VDD and the node Vbias3. For example, a capacitance of the capacitor C34 is the same as the capacitance of the capacitor C30. Accordingly, a bias voltage Vbias3 may be set to be constantly higher than the voltage Vbias. The other configurations of the low voltage detection unit VLDET3 are the same as those of the low voltage detection unit VLDET1 illustrated in FIG. 1.

In this embodiment, only by adding the capacitor C34 to the low voltage detection unit VLDET1 illustrated in FIG. 1, it is possible to generate the voltage Vbias3 whose value is between the power supply voltage VDD and the voltage Vbias. When the power supply voltage VDD decreases, the voltages Vbias, Vbias3 follow the power supply voltage VDD to decrease because of a coupling action of the capacitors C30, C34. The power supply voltage detection circuit PSVDET3 has the same operational waveform as that in FIG. 7. For example, the waveform of the voltage Vbias3 is the same as the waveform of the voltage Vbias2 illustrated in FIG. 7. In order to make the voltage Vbias3 lower than the voltage Vhold, the absolute value of the threshold voltage of the transistor P30 is designed higher than the threshold voltage of the transistor N32, for instance.

Note that it is also possible to increase the number of transistors diode coupled in the bias voltage generation circuit VBGEN illustrated in FIG. 8. For example, it is also possible to serially dispose two diode coupled p-channel MOS transistors between the power supply line VDD and the node Vbias3, and to serially dispose two diode coupled p-channel MOS transistors between the node Vbias3 and the node Vbias. Alternatively, it is also possible to serially dispose three diode coupled p-channel MOS transistors between the power supply line VDD and the node Vbias.

As described above, also in this embodiment, the same effect as that of the aforementioned embodiments may be obtained. Further, only by adding the capacitor C34 to the low voltage detection unit VLDET1 illustrated in FIG. 1, the power supply voltage VDD at which the transistor P34 is turned on may be adjusted more widely, compared to FIG. 1. In other words, the on-timing of the transistor P34 may be adjusted without depending on the power supply voltage VDD. As a result of this, the power supply voltage VDD at which the node V1 is reset to a low level may be freely adjusted.

Figure 9:
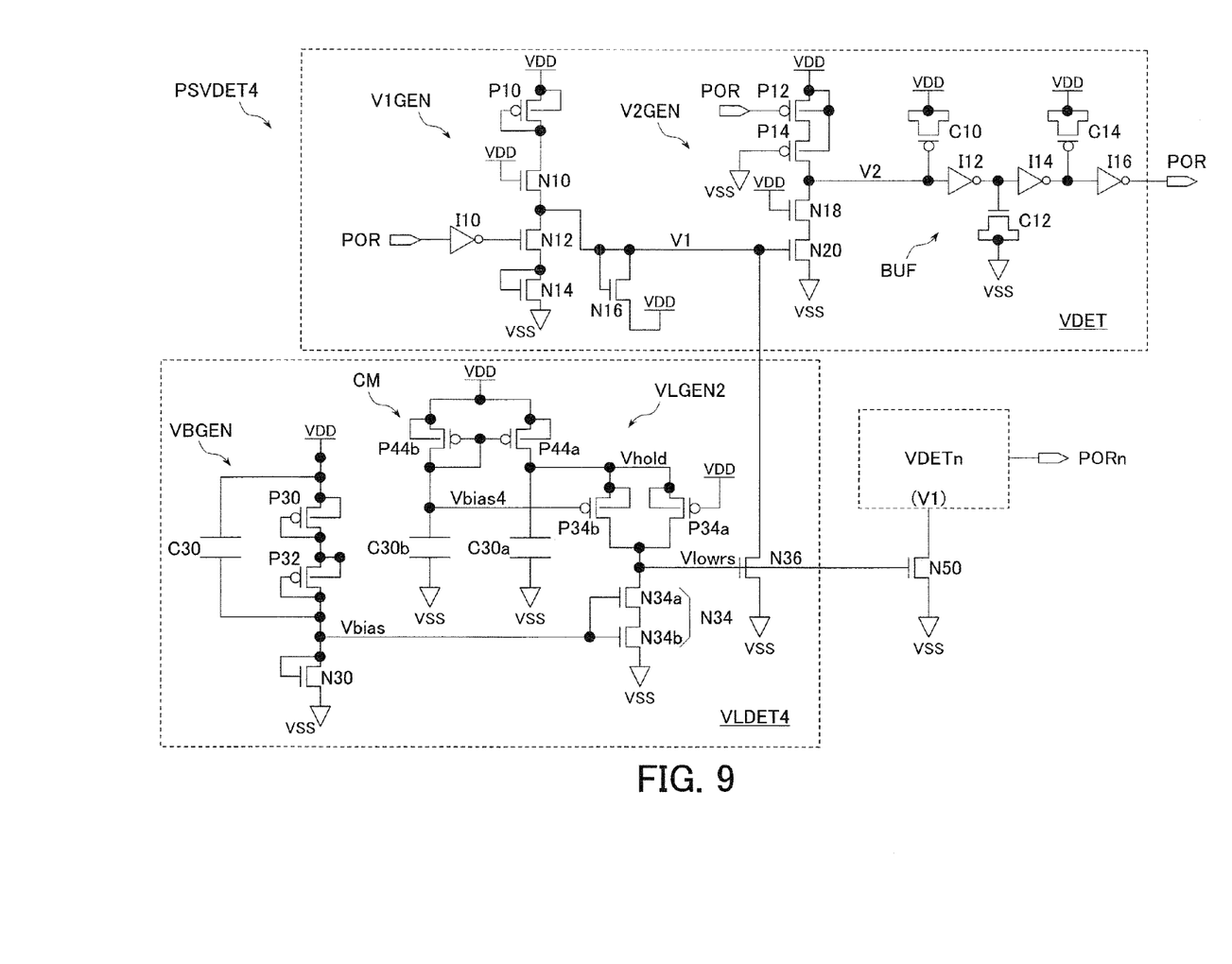
FIG. 9 illustrates an example of a power supply voltage detection circuit in yet another embodiment.

FIG. 9 illustrates an example of a power supply voltage detection circuit PSVDET4 in yet another embodiment. The same elements as those described in the aforementioned embodiments are denoted by the same reference numerals, and a detail explanation thereof will be omitted. The power supply voltage detection circuit PSVDET4 includes a low voltage detection unit VLDET4 instead of the low voltage detection unit VLDET1 illustrated in FIG. 1. The other configurations of the circuit are the same as those in FIG. 1. For example, the power supply voltage detection circuit PSVDET4 is formed on a silicon substrate as a semiconductor integrated circuit using a CMOS process.

The low voltage detection unit VLDET4 includes a bias voltage generation circuit VLGEN2 instead of the bias voltage generation circuit VLGEN1 illustrated in FIG. 1. The other configurations of the low voltage detection unit VLDET4 are the same as those of the low voltage detection unit VLDET1 illustrated in FIG. 1.

The bias voltage generation circuit VLGEN2 includes transistors P34a, N34a, N34b serially coupled between the node Vhold and the ground line VSS, a transistor P34b, a current mirror circuit CM, and capacitors C30a, C30b. A gate of the transistor P34a is coupled to a power supply line VDD. A substrate of the transistor P34a is coupled to the node Vhold. The transistors N34a, N34b are the same as those in FIG. 1. A gate of the transistor P34b is coupled to a node Vbias4, and a source and a substrate of the transistor P34b are coupled to the node Vhold. Drains of the transistors P34a, P34b, and a drain of the transistor N34a are coupled to the node Vlowrs.

The current mirror circuit CM includes transistors P44a, P44b coupled in parallel between a power supply line VDD and ground lines VSS. A gate of the transistor P44a is coupled to a drain of the transistor P44b. A drain of the transistor P44a is coupled to the node Vhold, and a drain of the transistor P44b is coupled to the node Vbias4. A current supply capability of the transistor P44a is higher than a current supply capability of the transistor P44b. Namely, an on-resistance of the transistor P44a is lower than an on-resistance of the transistor P44b. An absolute value of a threshold voltage of the transistor P44a is smaller than an absolute value of a threshold voltage of the transistor P44b. For this reason, a ratio W/L between a gate width W and a channel length L of the transistor P44a is set to be greater than a ratio W/L of the transistor P44b. Further, a threshold voltage (absolute value) of the transistor P34b is set to be higher than the threshold voltage (absolute value) of the transistor P44b.

The capacitor C30a is disposed between the transistor P44a and the ground line VSS. The capacitor C30b is disposed between the transistor P44b and the ground line VSS. Capacitances of the capacitors C30a, C30b are mutually the same. In order to reduce an error in the capacitances, the capacitors C30a, C30b are disposed close to each other on a semiconductor chip. The capacitors C30a, C30b may also be either MOS capacitors or ferroelectric capacitors, and may also be formed by using insulator films.

Figure 10:
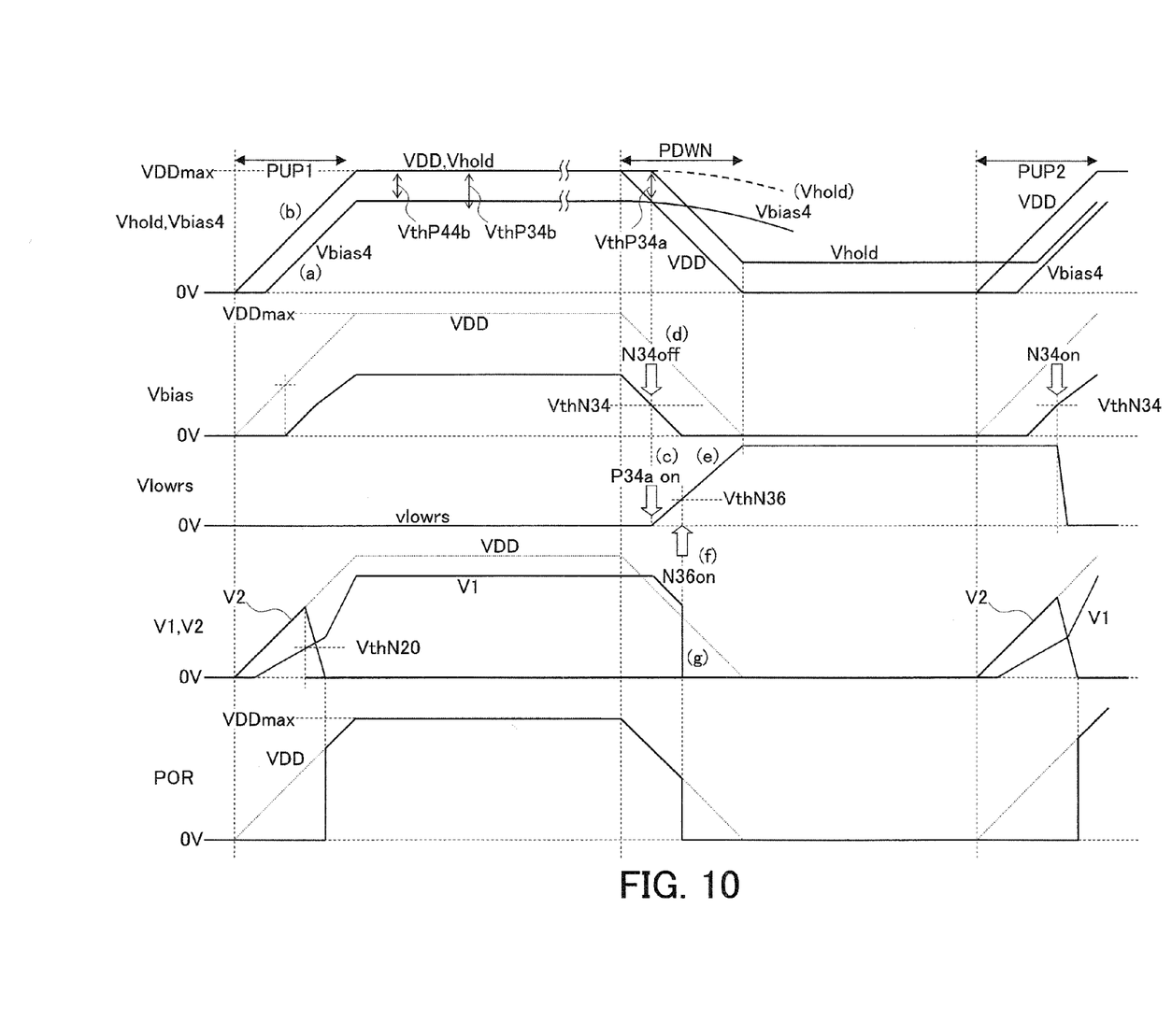
FIG. 10 illustrates an example of operation of the power supply voltage detection circuit illustrated in FIG. 9.

FIG. 10 illustrates an example of operation of the power supply voltage detection circuit illustrated in FIG. 9 (when the power supply voltage VDD rapidly decreases). A detailed explanation regarding the same operation as that in FIG. 3 will be omitted. The power supply voltage VDD, the voltages Vbias, Vlowrs, V1, V2, and the power-on reset signal POR have the same waveforms as those in FIG. 3.

During the power up period PUP1, the voltage of the node Vbias4 coupled to the drain of the diode coupled transistor P44b increases after the increase in the power supply voltage VDD (FIG. 10(a)). The transistor P44a receives, at its gate, the voltage Vbias4 that is lower than the power supply voltage VDD, so that the voltage of the node Vhold increases together with the power supply voltage VDD (FIG. 10(b)). The other waveforms in the power up period PUP1 are the same as those in FIG. 3.

At a time point in which the power supply voltage VDD is increased to the maximum value VDDmax, the voltage Vbias4 is lower than the power supply voltage VDD by the threshold voltage (absolute value) of the transistor P44b. Therefore, the amount of electric charge accumulated in the capacitor C30a is greater than the amount of electric charge accumulated in the capacitor C30b. An absolute value VthP34b of the threshold voltage of the transistor P34b is greater than an absolute value VthP44b of the threshold voltage of the transistor P44b. Accordingly, the transistor P34b is not turned on even when the power supply voltage VDD is increased.

During the power down period PDWN, when the power supply voltage VDD decreases, the voltages Vhold, Vbias4 gradually decrease due to a leak current from the capacitors C30a, C30b to the ground line VSS and the like. When the power supply voltage VDD becomes lower than the voltage Vhold, and the difference between the power supply voltage VDD and the voltage Vhold becomes greater than an absolute value VthP34a of the threshold voltage of the transistor P34a, the transistor P34a is turned on (FIG. 10(c)). Similar to FIG. 3, when the voltage Vbias becomes lower than the threshold voltage VthN34 of the transistor string N34, the respective transistors N34a, N34b are turned off (FIG. 10(d)). Accordingly, the electric charge is supplied from the capacitor C30a to the node Vlowrs via the node Vhold, and the voltage of the node Vlowrs increases in accordance with the decrease in the voltage Vhold (FIG. 10(e)). Note that a dotted line representing the voltage Vhold illustrated in the drawing indicates a waveform when assuming the transistor P34a is not turned on.

Thereafter, similar to FIG. 3, the transistor N36 is turned on and the node V1 is reset to 0V (FIG. 10 (f, g)). After the power down period PDWN, the electric charge accumulated in the capacitor C30b are gradually pulled out from the capacitor C30b to the ground line VSS and the like as a leak current component. The operation during the power up period PUP2 is the same as that in FIG. 3.

Figure 11:
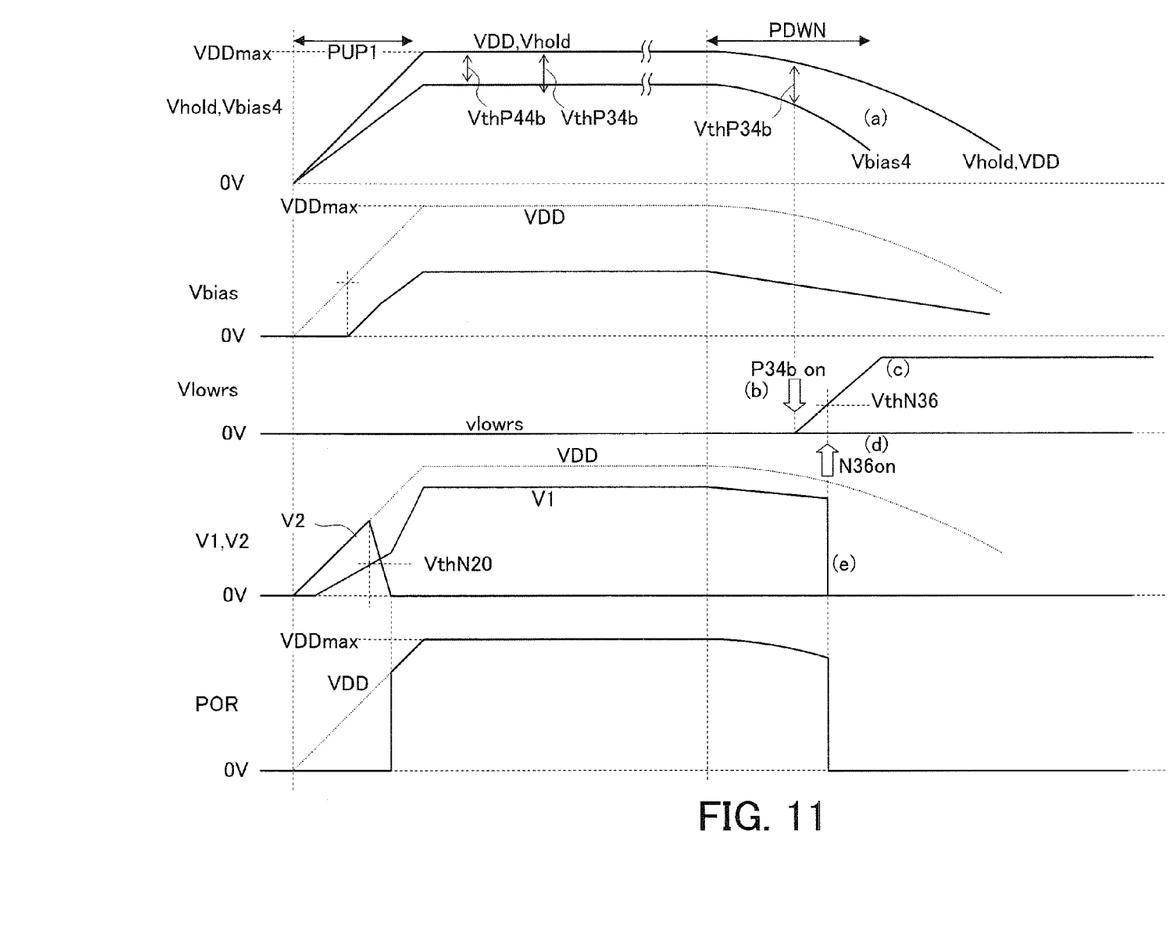
FIG. 11 illustrates another example of operation of the power supply voltage detection circuit illustrated in FIG. 9.

FIG. 11 illustrates another example of operation of the power supply voltage detection circuit illustrated in FIG. 9 (when the power supply voltage VDD slowly decreases). A detailed explanation regarding the same operation as that in FIG. 3 and FIG. 10 will be omitted. The waveforms in the power up period PUP1 are the same as those in FIG. 10. In this example, a load capacitance of the power supply line VDD is large, and the power supply voltage VDD gradually decreases in the power down period PDWN.

The voltages of the nodes Vhold, Vbias4 gradually decrease due to a leak current from the capacitors C30a, C30b. Since the power supply voltage VDD gradually decreases, when the voltages Vhold, Vbias4 decrease, the electric charge is supplied from the power supply line VDD to the nodes Vhold, Vbias4. At this time, since the on-resistance of the transistor P44a is lower than the on-resistance of the transistor P44b, a large amount of electric charge is supplied from the power supply line VDD to the node Vhold, compared to the amount of electric charge supplied to the node Vbias4. Accordingly, the voltage Vhold decreases slowly compared to the voltage Vbias4 (FIG. 11(a)).

Note that the absolute value of the threshold voltage of the transistor P44a is smaller than the absolute value of the threshold voltage of the transistor P44b, and the voltage Vbias4 is lower than the voltage Vhold. The transistor P44a is turned on by receiving the low voltage Vbias4 at its gate. Accordingly, the voltage Vhold changes by following the power supply voltage VDD.

When a difference between the voltage Vbias4 and the voltage Vhold becomes greater than the absolute value VthP34b of the threshold voltage of the transistor P34b, the transistor P34b is turned on (FIG. 11(b)). Accordingly, similar to FIG. 10, the voltage Vlowrs increases and the transistor N36 is turned on (FIG. 11(c, d)). Further, the node V1 is reset to a low level (FIG. 11(e)).

As described above, also in this embodiment, the same effect as that of the aforementioned embodiments may be obtained. Further, by coupling the current mirror circuit CM including the pair of transistors P44a, P44b each having a different on-resistance, and the capacitors C30a, C30b to the nodes Vhold, Vbias4, it is possible to securely reset the node V1 even when the power supply voltage VDD slowly decreases. As a result of this, the power-on reset signal POR may be securely generated during the following power up period PUP2.

Note that the aforementioned embodiments have described the examples in which the node V1 in the voltage detection unit VDET is reset by utilizing the increase in the voltage Vlowrs. However, it is also possible to detect the decrease in the power supply voltage VDD by utilizing the increase in the voltage Vlowrs, for example. Specifically, it is also possible to make each of the low voltage detection units VLDET1-4 operate as a low-level detection circuit of the power supply voltage VDD. The low-level detection circuit may be used for saving (protecting) data held in the latch circuit, and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
a first voltage detection circuit an of a power supply voltage and generates a first signal;
a second voltage detection circuit that detects a decrease of the power supply voltage and generates a second signal; and
a power supply voltage detection signal output circuit that outputs a power supply voltage detection signal based on the first signal and the second signal, wherein
the second voltage detection circuit includes:
a first transistor including one end which receives the power supply voltage from a first power supply line, a gate which receives the power supply voltage from the first power supply line, and other end coupled to a first node;
a second transistor including a gate which receives a first bias voltage via a second node, one end coupled to the first node, and other end coupled to a third node;
a third transistor including one end coupled to a second power supply line, a gate coupled to a fourth node, and other end coupled to the third node;
a first bias voltage generation circuit that supplies the first bias voltage to the second node;
a second bias voltage generation circuit that supplies a second bias voltage to the fourth node; and
a first capacitor coupled to the first node and configured to be charged from the power supply voltage through the first transistor, wherein
when the power supply voltage decreases, the first and second bias voltage generation circuits decrease the first and second bias voltages, the second transistor is turned on, the third transistor is turned off, an electric charge of the first capacitor moves to the third node, and the third node outputs the second signal.

2. The semiconductor device according to claim 1, further comprising
at least one of fourth transistors provided between the third transistor and the second power supply line.

3. The semiconductor device according to claim 1, wherein
the second bias voltage generation circuit includes a first dividing resistance circuit provided between the first power supply line and the second power supply line, and outputs a first divided voltage output from the first dividing resistance circuit as the second bias voltage.

4. The semiconductor device according to claim 3, wherein
the second bias voltage generation circuit includes a second capacitor that stores the electric charge corresponding to a voltage difference between the power supply voltage supplied from the first power supply line and the first divided voltage.

5. The semiconductor device according to claim 3, wherein
the first dividing resistance circuit includes a first resistor element and a second resistor element, and outputs the first divided voltage from a coupling node between the first resistor element and the second resistor element.

6. The semiconductor device according to claim 5, wherein
at least one of the first resistor element and the second resistor element includes a diode coupled transistor.

7. The semiconductor device according to claim 1, wherein
the first bias voltage generation circuit outputs the power supply voltage as the first bias voltage.

8. A system, comprising:
a semiconductor device including a power supply voltage detection circuit; and
a controller controlling the semiconductor device, wherein
the power supply voltage detection circuit includes:
a first voltage detection circuit that detects an increase of a power supply voltage and generates a first signal;
a second voltage detection circuit that detects a decrease of the power supply voltage and generates a second signal; and
a power supply voltage detection signal output circuit that outputs a power supply voltage detection signal based on the first signal and the second signal, wherein
the second voltage detection circuit includes:
a first transistor including one end which receives a power supply voltage from a first power supply line, a gate which receives the power supply voltage from the first power supply line, and other end coupled to a first node;
a second transistor including a gate which receives a first bias voltage via a second node, one end coupled to the first node, and other end coupled to a third node;
a third transistor including one end coupled to a second power supply line, a gate coupled to a fourth node, and other end coupled to the third node;
a first bias voltage generation circuit which supplies the first bias voltage to the second node; and
a second bias voltage generation circuit which supplies a second bias voltage to the fourth node; and
a first capacitor coupled to the first node and configured to be charged from the power supply voltage through the first transistor, wherein
when the power supply voltage decreases, the first and second bias voltage generation circuits decrease the first and second bias voltages, the second transistor is turned on, the third transistor is turned off, an electric charge of the first capacitor moves to the third node, and the third node outputs the second signal.

9. The system according to claim 8, wherein:
the controller supplies a control signal to the semiconductor device, in which the control signal activates the semiconductor device; and
the semiconductor device makes an internal circuit to operate based on the power supply voltage detection signal output from the power supply voltage detection circuit and the control signal.

10. The semiconductor device according to claim 1, wherein
the second voltage detection circuit includes a transistor that has a gate coupled to the third node, one end coupled to a transmission node of the first signal, other end coupled to the second power supply line, and configured to be switched on based on a movement of the electric charge of the first capacitor to the third node.

* * * * *